US012736497B2

(12) United States Patent
Hsu et al.

(10) Patent No.: US 12,736,497 B2
(45) Date of Patent: Sep. 15, 2026

(54) BIOCHIP AND MANUFACTURING METHOD THEREOF

(71) Applicant: EPISIL TECHNOLOGIES INC., Hsinchu County (TW)

(72) Inventors: Wen Ting Hsu, Hsinchu County (TW); De Chuan Liu, Hsinchu County (TW); Kuo Yu Li, Hsinchu County (TW)

(73) Assignee: EPISIL TECHNOLOGIES INC., Hsinchu County (TW)

( * ) Notice: Subject to any disclaimer, the term of this patent is extended or adjusted under 35 U.S.C. 154(b) by 383 days.

(21) Appl. No.: 18/629,931

(22) Filed: Apr. 8, 2024

(65) Prior Publication Data

US 2025/0277768 A1 Sep. 4, 2025

(30) Foreign Application Priority Data

Feb. 29, 2024 (TW) ................................ 113107268

(51) Int. Cl.
*G01N 27/414* (2006.01)
*H10D 30/01* (2025.01)
*H10D 30/67* (2025.01)

(52) U.S. Cl.
CPC ....... *G01N 27/4145* (2013.01); *H10D 30/031* (2025.01); *H10D 30/67* (2025.01)

(58) Field of Classification Search
None
See application file for complete search history.

(56) References Cited

U.S. PATENT DOCUMENTS

2015/0053925 A1 2/2015 Liu et al.

FOREIGN PATENT DOCUMENTS

| | | |
|---|---|---|
| CN | 103842817 | 6/2014 |
| CN | 107799596 | 3/2018 |
| JP | 2008128803 | 6/2008 |
| JP | 2012073104 | 4/2012 |
| JP | 2020046260 | 3/2020 |
| JP | 2021099330 | 7/2021 |
| JP | 2023097030 | 7/2023 |
| TW | 1809715 | 7/2023 |

OTHER PUBLICATIONS

"Office Action of Japan Counterpart Application", issued on May 8, 2025, p. 1-p. 3.

*Primary Examiner* — Sarah K Salerno
(74) *Attorney, Agent, or Firm* — JCIPRNET

(57) ABSTRACT

A biochip is configured for detecting biological materials in a solution and includes at least one detection unit, which includes a substrate, a first insulation layer disposed on the substrate, a semiconductor layer, a second insulation layer, a first metal layer, a second metal layer and a protection layer. The semiconductor layer is disposed on the first insulation layer and includes multiple reaction regions. The second insulation layer is disposed on the semiconductor layer and includes a first part, a second part surrounding the first part and a first opening. The first opening exposes the reaction regions. The first metal layer is disposed on the second part and includes source electrode, drain electrode, gate electrode and first wall structure. The protection layer includes a flat part defining a second opening, a first protruding part defining a third opening and a second protruding part defining a fourth opening.

10 Claims, 12 Drawing Sheets

BIOCHIP AND MANUFACTURING METHOD THEREOF

CROSS-REFERENCE TO RELATED APPLICATION

This application claims the priority benefit of Taiwan application serial no. 113107268, filed on Feb. 29, 2024. The entirety of the above-mentioned patent application is hereby incorporated by reference herein and made a part of this specification.

BACKGROUND

Technical Field

The disclosure relates to a semiconductor chip and a manufacturing method thereof, and in particular relates to a biochip and a manufacturing method thereof.

Description of Related Art

In a general biochip, the space that may accommodate solution is usually limited by the size of the reaction region. Therefore, once the solution is in a larger volume or when errors occur in the addition of the solution, the problem of solution overflow may easily occur.

SUMMARY

A biochip and a manufacturing method thereof, which may prevent the issue of solution overflow and accommodate a larger volume of solution, enhancing the sensitivity of detection and simultaneously detecting various biological materials without interfering with each other, are provided in the disclosure.

The biochip of the disclosure is configured for detecting biological materials in a solution and includes at least one detection unit. The detection unit includes a substrate, a first insulation layer, a semiconductor layer, a second insulation layer, a first metal layer, a second metal layer, and a protection layer. The first insulation layer is disposed on the substrate. The semiconductor layer is disposed on the first insulation layer and includes multiple reaction regions. The second insulation layer is disposed on the semiconductor layer and includes a first part, a second part, and a first opening. The second part surrounds the first part. The first opening separates the first part and the second part and exposes the reaction regions. The first metal layer is disposed on the second part and includes a source electrode, a drain electrode, a gate electrode and a first wall structure that are separated from each other. The second metal layer includes a second wall structure and a biological electrode. The second wall structure is disposed on the first wall structure, and the biological electrode is disposed on the first part. The protection layer is disposed on the first metal layer and the second metal layer. The protection layer has a second opening, a third opening and a fourth opening, and includes a flat part, a first protruding part and a second protruding part. The flat part covers the second part exposed by the first metal layer and surrounds and defines the second opening. The first protruding part covers the source electrode, the drain electrode and the gate electrode, and surrounds and defines the third opening. The second protruding part covers the second wall structure and surrounds and defines the fourth opening. In a normal direction of the substrate, the first opening, the second opening, the third opening, and the fourth opening overlap.

In an embodiment of the disclosure, the semiconductor layer further includes a source region and a drain region. The source electrode surrounds the first opening and is electrically connected to the source region. The drain electrode surrounds the source electrode and is electrically connected to the drain region, the gate electrode surrounds the drain electrode and is electrically connected to the substrate, and the first wall structure surrounds the gate electrode.

In an embodiment of the disclosure, the source electrode, the drain electrode, the gate electrode and the first wall structure are on the same layer, and the first wall structure electrically insulates the source electrode, the drain electrode and the gate electrode.

In an embodiment of the disclosure, the solution is disposed in at least the first opening, the second opening and the third opening. The solution contacts the biological electrode and multiple reaction regions of the semiconductor layer.

In one embodiment of the disclosure, the biological electrode and the second wall structure are on the same layer, the biological electrode and the second wall structure are separated from each other, and the second wall structure electrically insulates the biological electrode.

In an embodiment of the disclosure, the first protruding part completely surrounds the third opening, and the second protruding part completely surrounds the fourth opening.

In an embodiment of the disclosure, in the normal direction, an upper surface of the second protruding part is higher than an upper surface of the first protruding part, and the upper surface of the first protruding part is higher than an upper surface of the flat part.

In an embodiment of the disclosure, the third opening is larger than the second opening, and the fourth opening is larger than the third opening.

In an embodiment of the disclosure, the third opening includes an adding region and multiple detection regions. The adding region is disposed corresponding to the first part. The detection regions are connected to the adding region and are disposed corresponding to multiple reaction regions.

The manufacturing method of the biochip of the disclosure includes the following operation. A substrate is provided. A first insulation layer is formed on the substrate. A semiconductor layer is formed on the first insulation layer, in which the semiconductor layer includes multiple reaction regions. A second insulation layer is formed on the semiconductor layer, in which the second insulation layer includes a first part, a second part and a first opening, the second part surrounds the first part, and the first opening separates the first part and the second part and exposes multiple reaction regions. A first metal layer is formed on the second part, in which the first metal layer includes a source electrode, a drain electrode, a gate electrode and a first wall structure that are separated from each other. A second metal layer is formed, in which the second metal layer includes a second wall structure and a biological electrode, the second wall structure is disposed on the first wall structure, and the biological electrode is disposed on the first part. A protection layer is formed on the first metal layer and the second metal layer, in which the protection layer has a second opening, a third opening and a fourth opening, and the protection layer includes a flat part, a first protruding part and a second protruding part. The flat part covers the second part exposed by the first metal layer and surrounds and defines the second opening. The first protruding part covers the source electrode, the drain electrode and the gate electrode, and surrounds and defines the third opening. The second protruding part covers the second wall structure and surrounds and defines the fourth opening. In a normal direction of the substrate, the first opening, the second opening, the third opening, and the fourth opening overlap.

Based on the above, in the biochip and the manufacturing method thereof according to an embodiment of the disclosure, by disposing multiple reaction regions in one detection unit to detect the same kind of biological material, the detection sensitivity may be improved by accumulating signals detected by the multiple reaction regions. Compared with general biochips, the biochip of this embodiment may increase the volume of solution that the biochip may hold through the arrangement of the fourth opening, so as to accommodate a larger volume of solution without the concern of overflow and subsequent cross-contamination. This in turn enhances the operational flexibility and convenience of the biochip. In addition, since the multiple detection units in the biochip of this embodiment may be respectively used to detect different kinds of biological materials without the concern of overflow and subsequent cross-contamination between different detection units. This in turn enables the biochip to detect multiple biological materials at the same time without interfering with each other.

In order to make the above-mentioned features and advantages of the disclosure comprehensible, embodiments accompanied with drawings are described in detail below.

DETAILED DESCRIPTION OF DISCLOSED EMBODIMENTS

Figure 1:
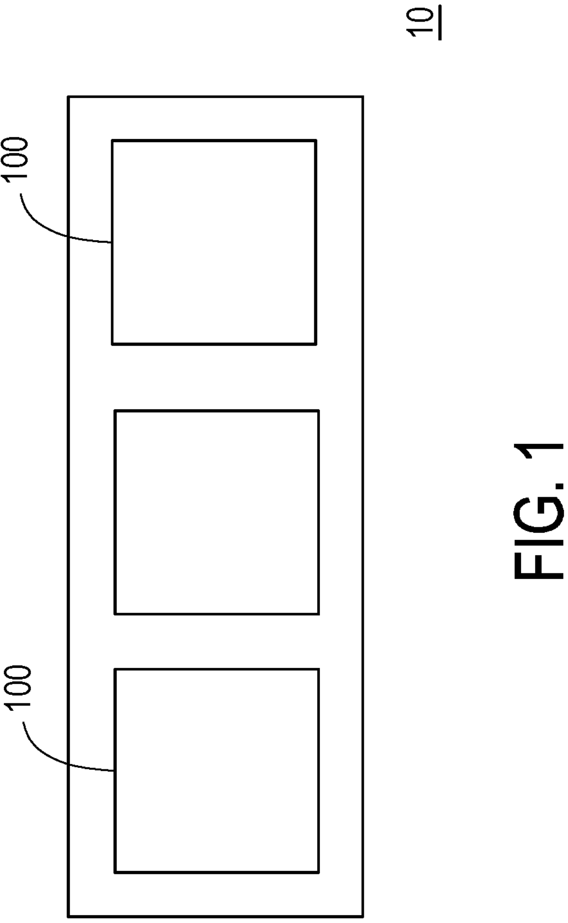
FIG. 1 is a top schematic diagram of a biochip of an embodiment of the disclosure.
Figure 2A:
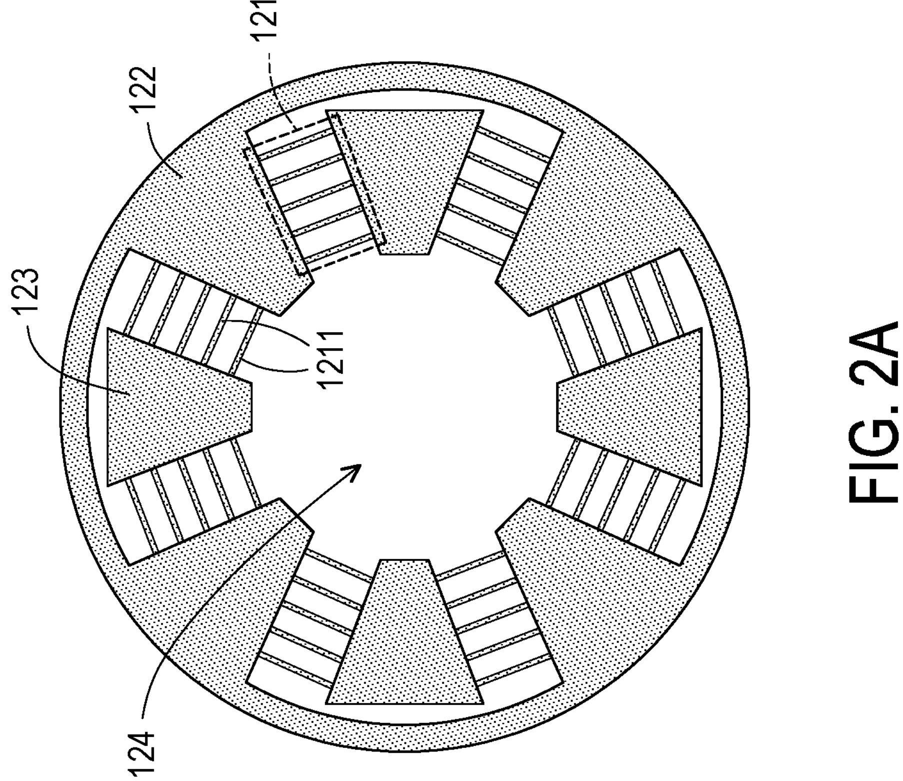
FIG. 2A to FIG. 2C are top schematic diagrams of the manufacturing method of the detection unit in the biochip of FIG. 1.
Figure 2B:
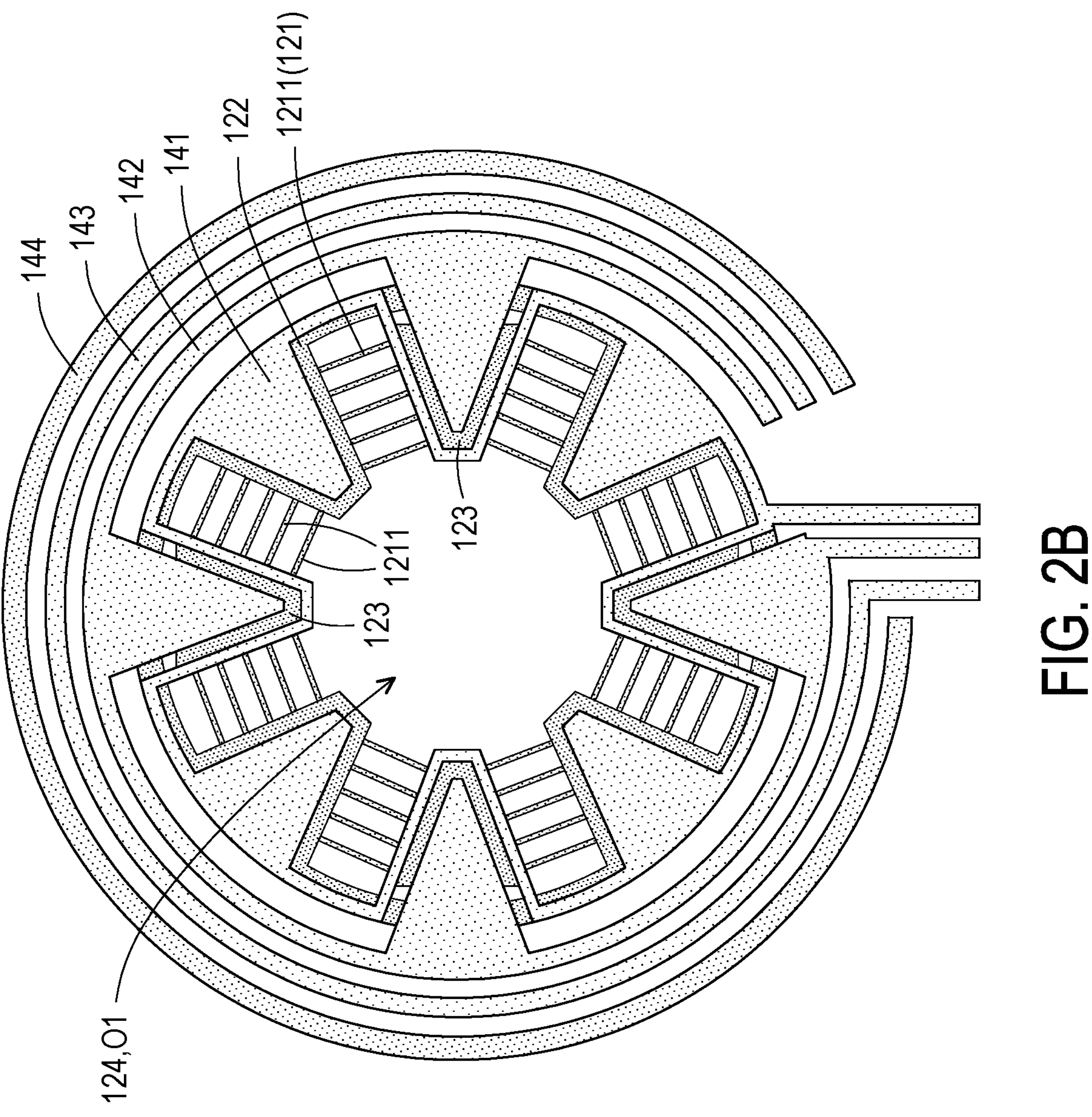
Figure 2C:
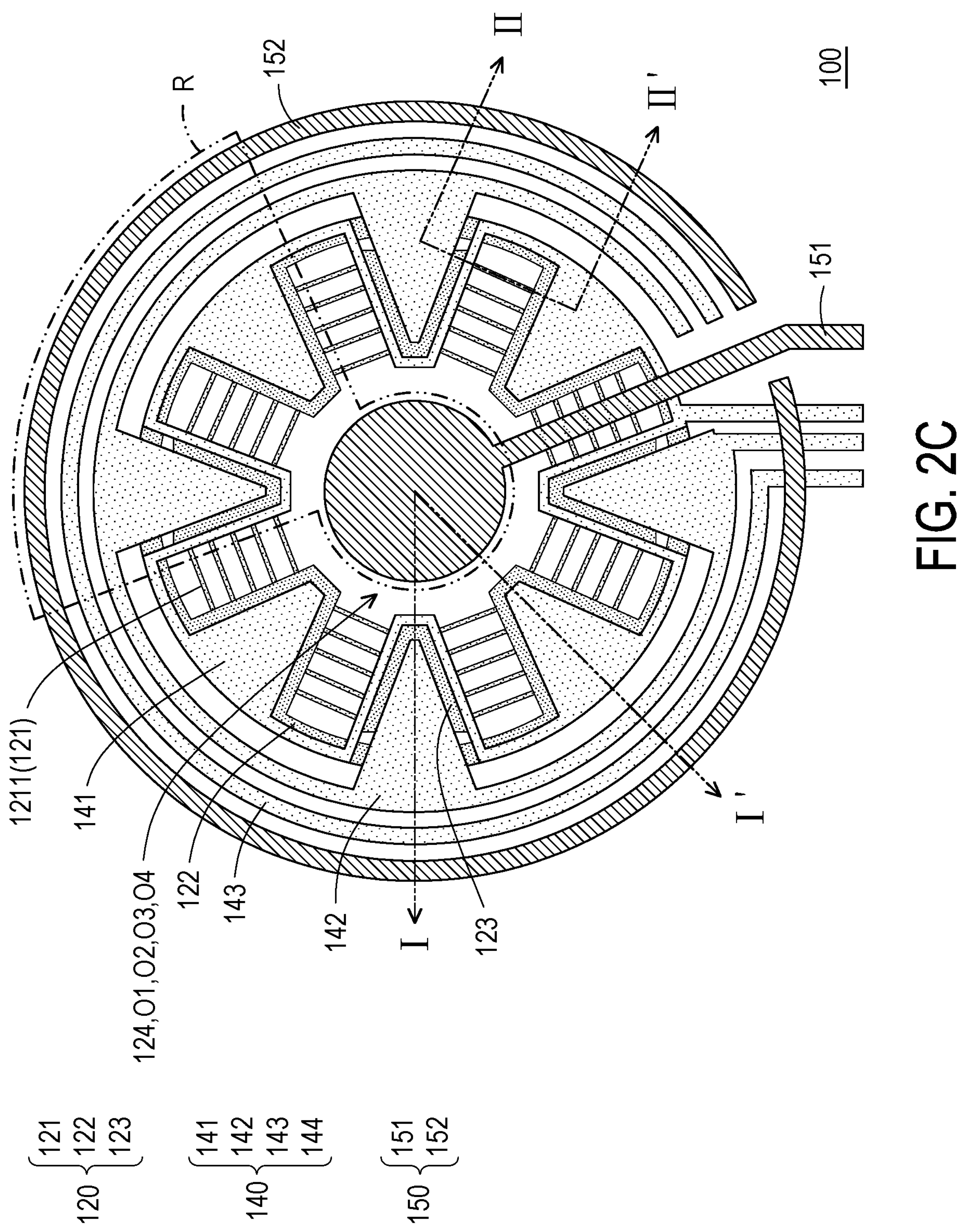
Figure 3A:
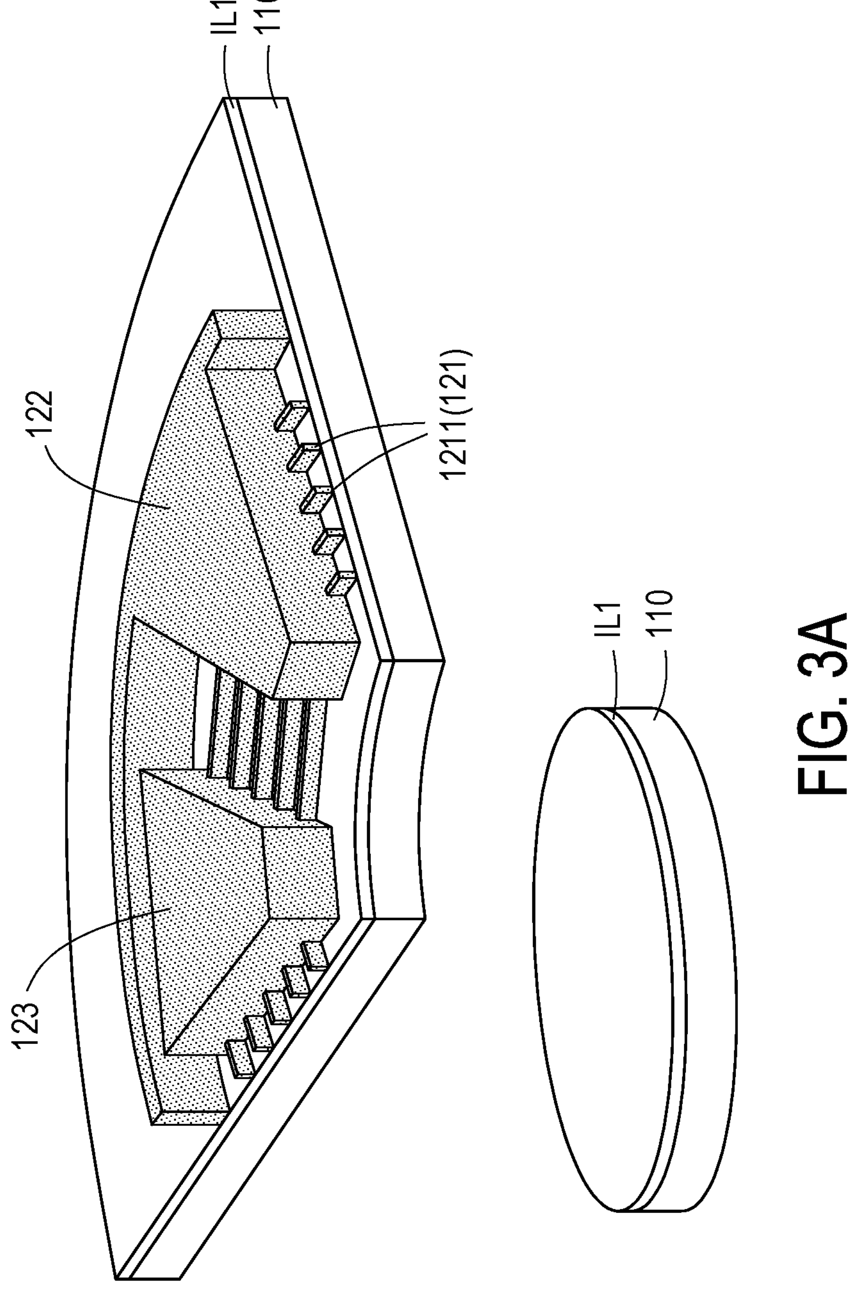
FIG. 3A to FIG. 3E are three-dimensional schematic diagrams of the manufacturing method of the region R in the biochip of FIG. 2C.
Figure 3B:
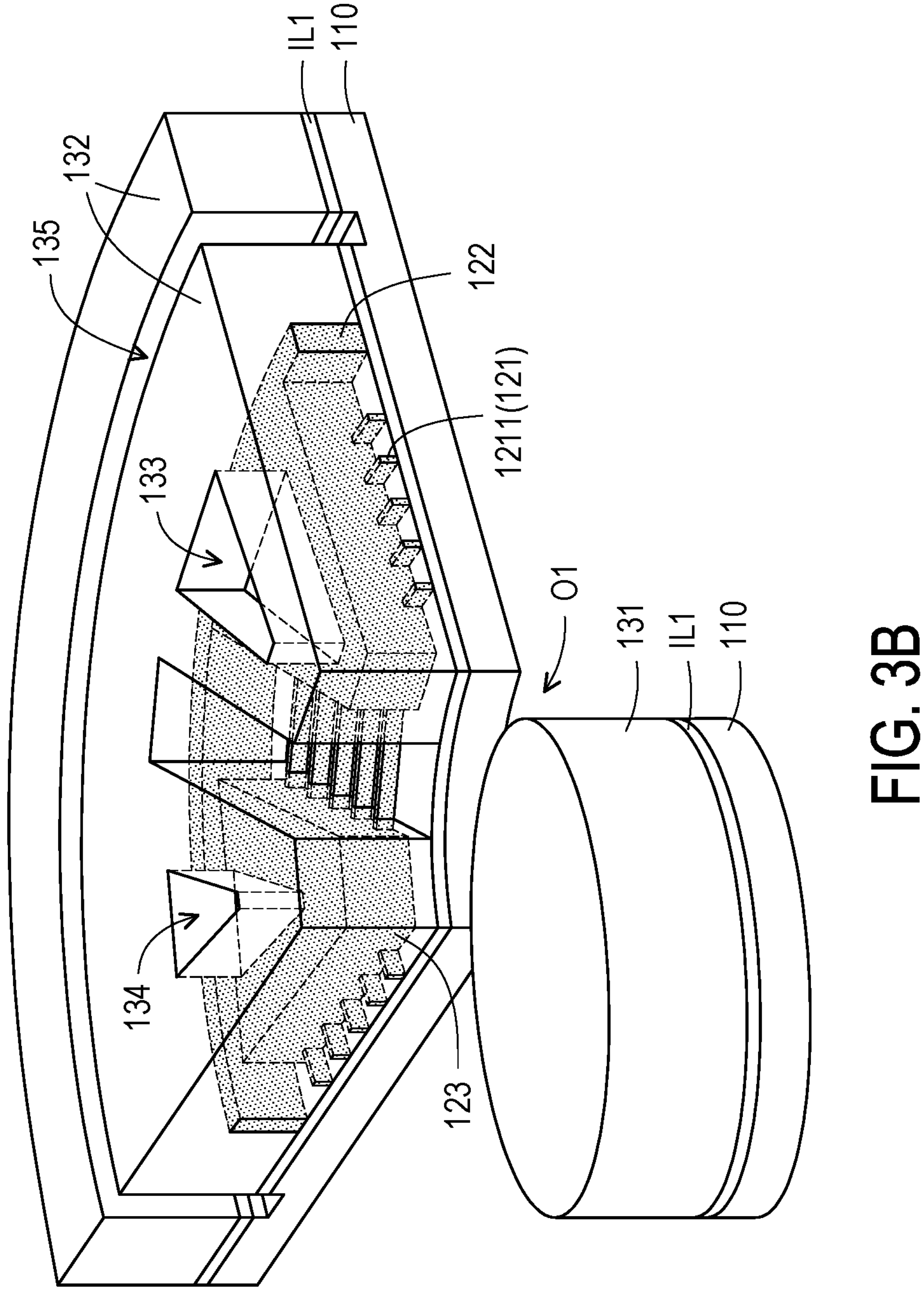
Figure 3C:
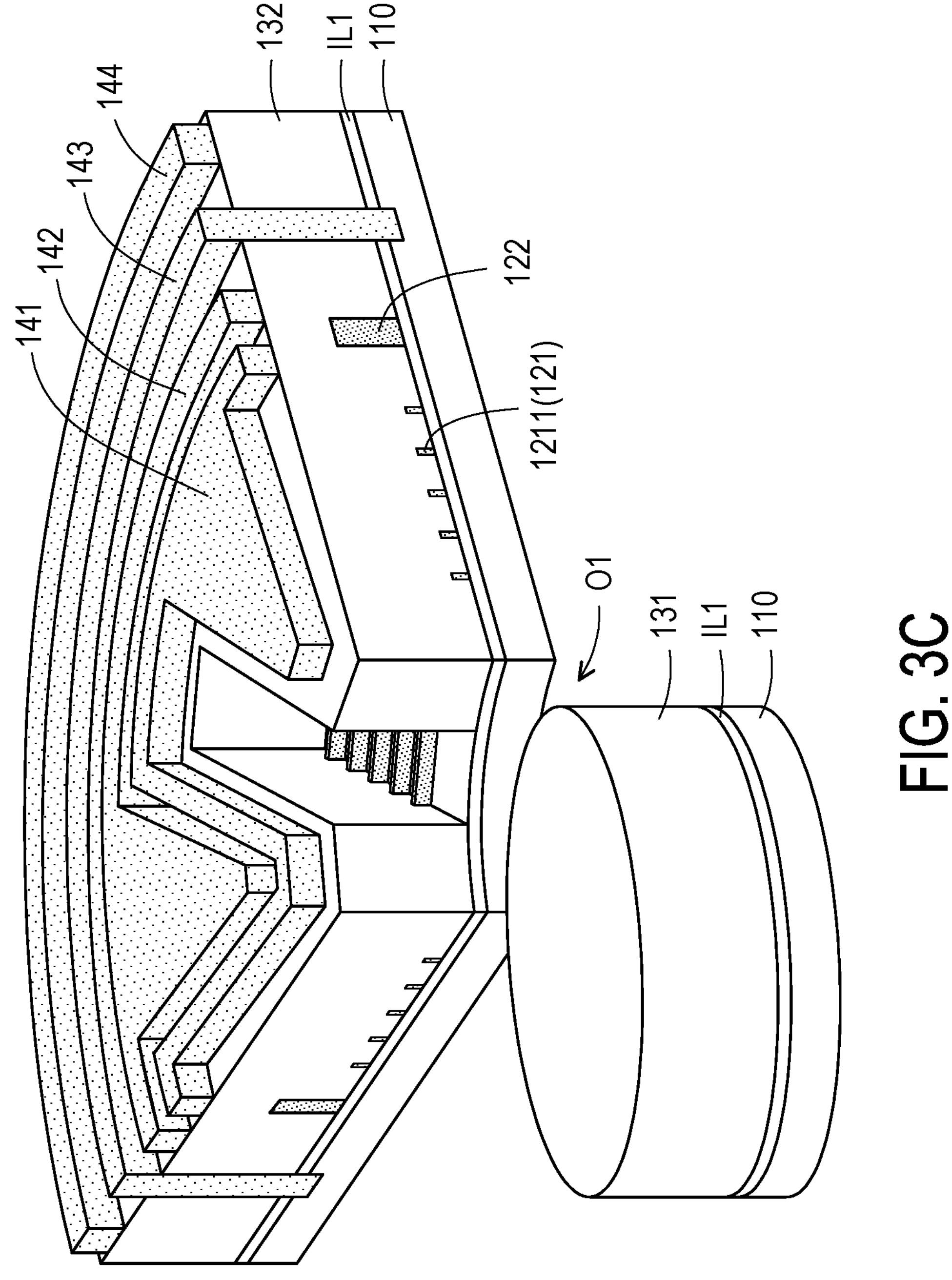
Figure 3D:
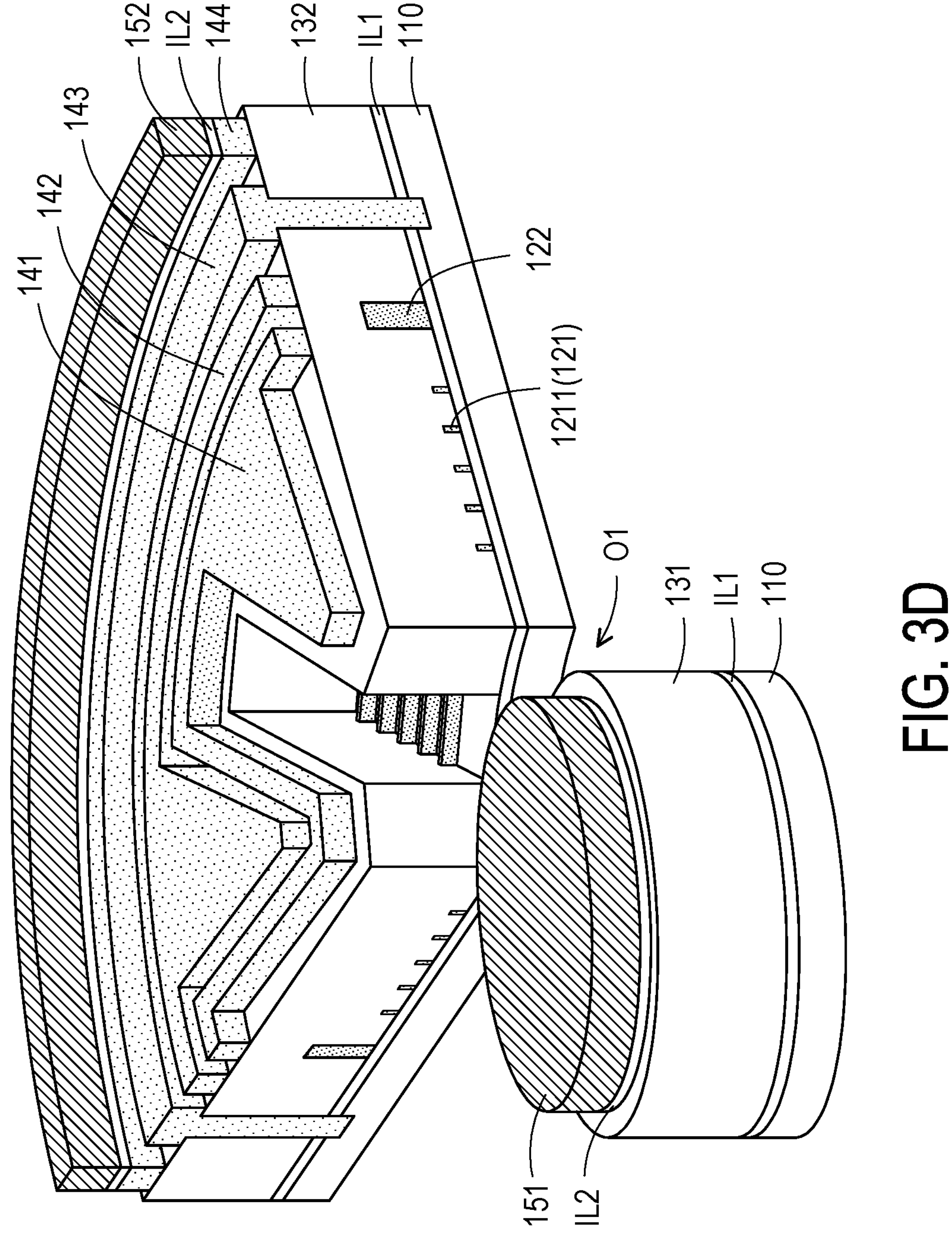
Figure 3E:
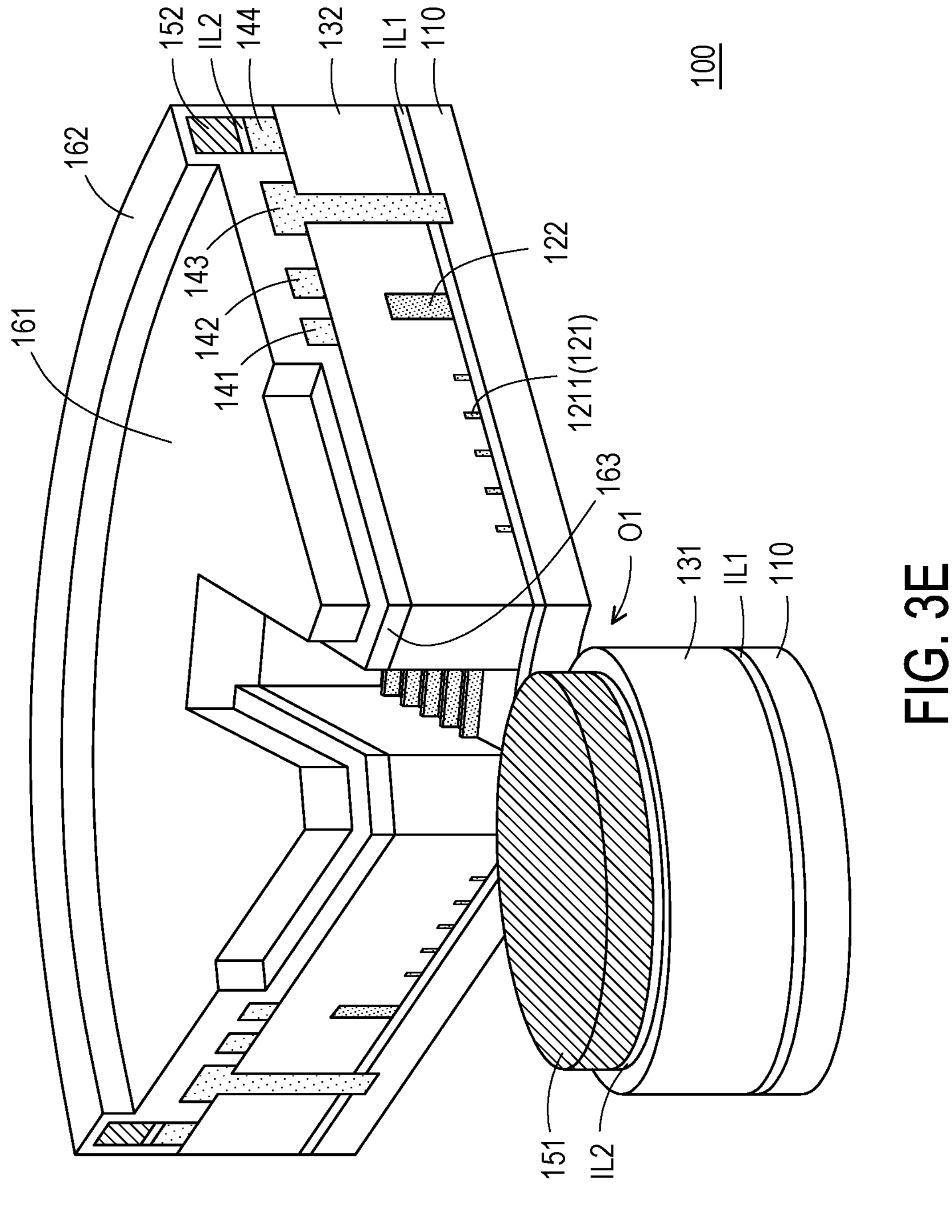
Figure 4:
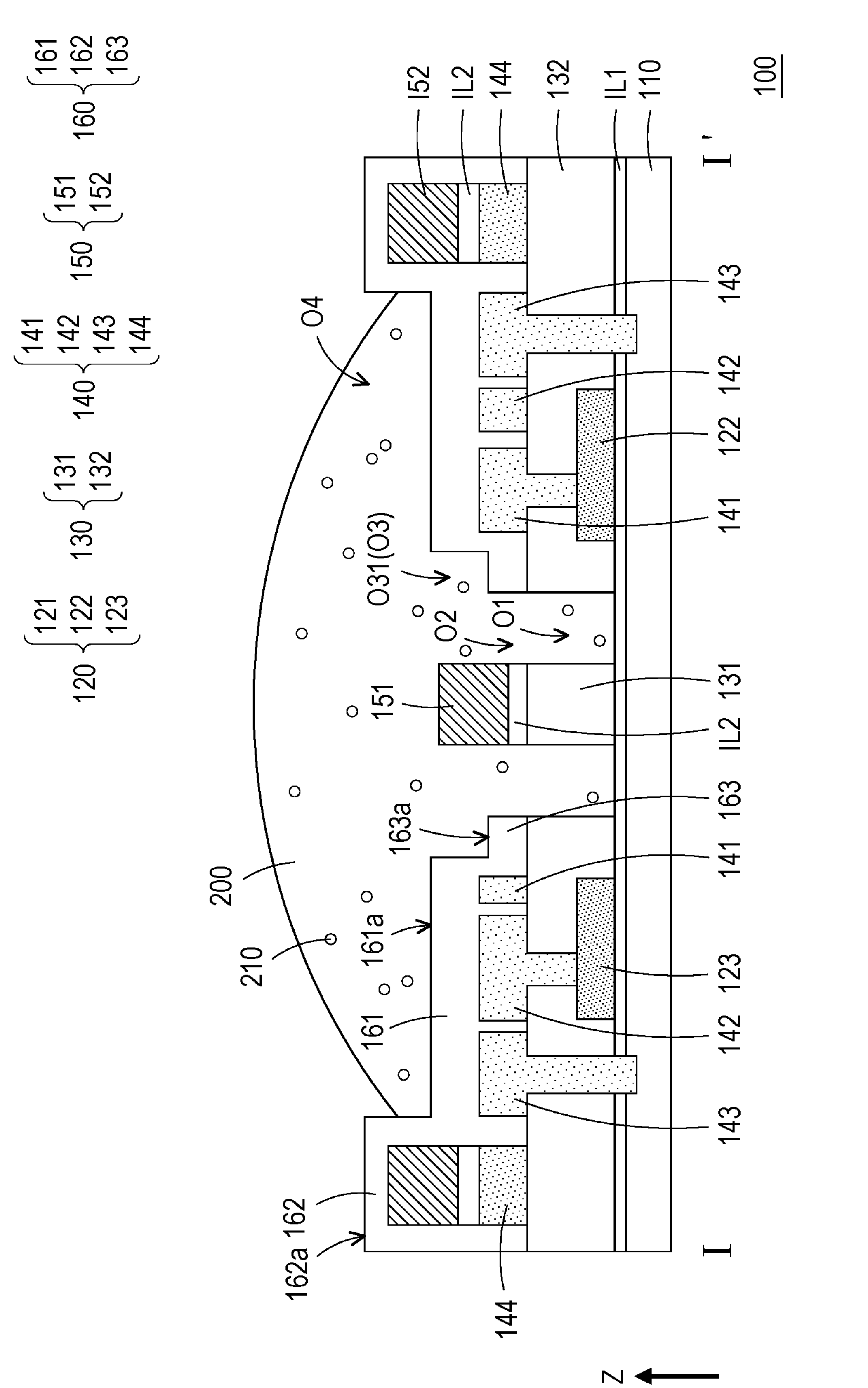
FIG. 4 is a cross-sectional schematic diagram of the biochip of FIG. 2C along the section line I-I'.
Figure 5:
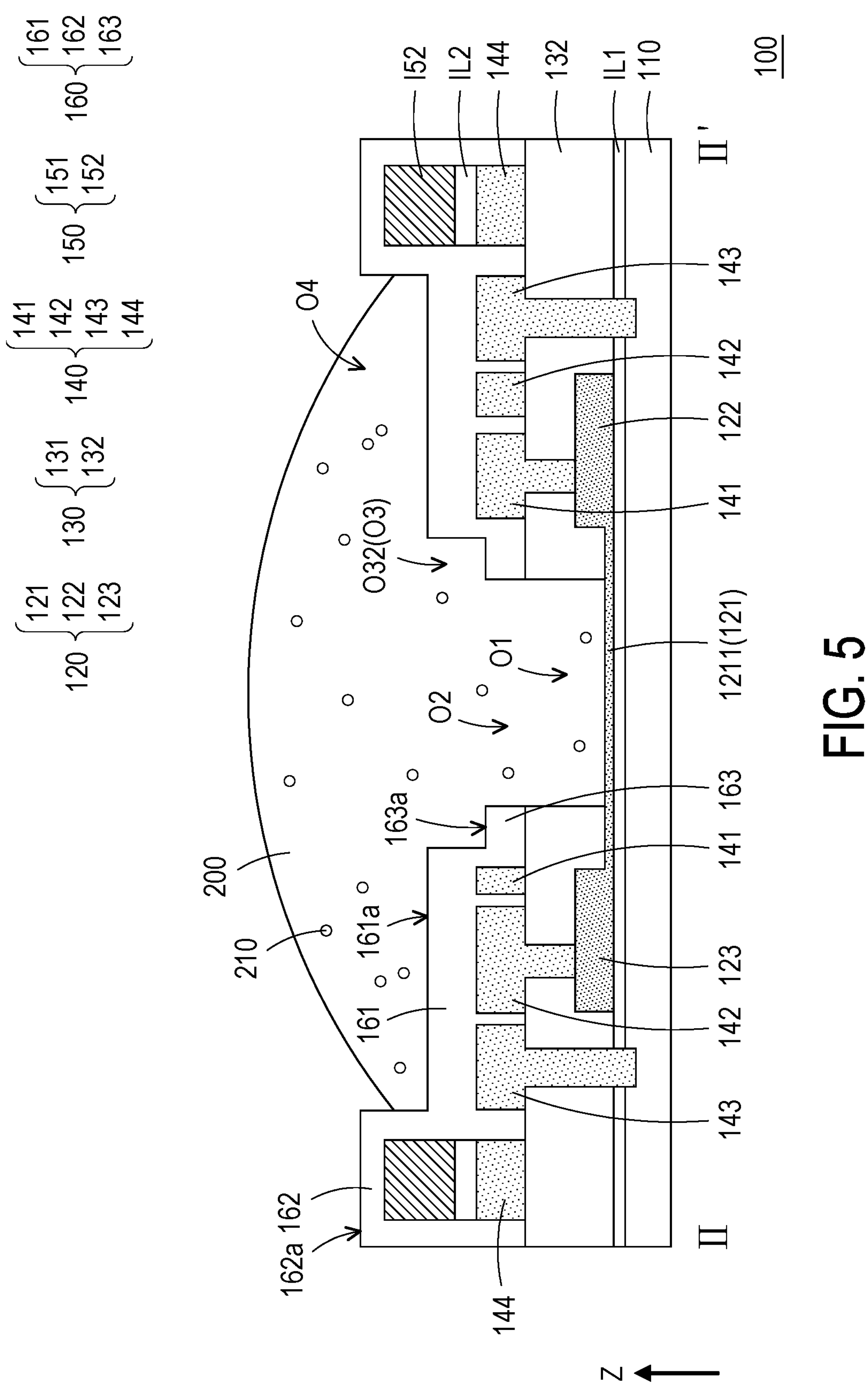
FIG. 5 is a cross-sectional schematic diagram of the biochip of FIG. 2C along the section line II-II'.

FIG. 1 is a top schematic diagram of a biochip of an embodiment of the disclosure. FIG. 2A to FIG. 2C are top schematic diagrams of the manufacturing method of the detection unit in the biochip of FIG. 1. FIG. 3A to FIG. 3E are three-dimensional schematic diagrams of the manufacturing method of the region R in the biochip of FIG. 2C. FIG. 4 is a cross-sectional schematic diagram of the biochip of FIG. 2C along the section line I-I'. FIG. 5 is a cross-sectional schematic diagram of the biochip of FIG. 2C along the section line II-II'. For clarity of the drawings and convenience of explanation, FIG. 2A to FIG. 2C omit the substrate 110, the first insulation layer IL1, the second insulation layer 130, the insulation layer IL2, and the protection layer 160 in the biochip 10.

Referring to FIG. 1, FIG. 2C, FIG. 3E, FIG. 4 and FIG. 5 at the same time, the biochip 10 of this embodiment may include at least one detection unit 100 (FIG. 1 schematically illustrates three detection units 100, but not limited thereto). The detection unit 100 includes a substrate 110, a first insulation layer IL1, a semiconductor layer 120, a second insulation layer 130, a first metal layer 140, a second metal layer 150, and a protection layer 160. The first insulation layer IL1 is disposed on the substrate 110. The semiconductor layer 120 is disposed on the first insulation layer IL1 and includes multiple reaction regions 121. The second insulation layer 130 is disposed on the semiconductor layer 120, and the second insulation layer 130 includes a first part 131, a second part 132, and a first opening O1. The second part 132 surrounds the first part 131. The first opening O1 separates the first part 131 and the second part 132, and the first opening O1 exposes the reaction regions 121. The first metal layer 140 is disposed on the second part 132, and the first metal layer 140 includes a source electrode 141, a drain electrode 142, a gate electrode 143 and a first wall structure 144 that are separated from each other. The second metal layer 150 includes a second wall structure 152 and a biological electrode 151. The second wall structure 152 is disposed on the first wall structure 144, and the biological electrode 151 is disposed on the first part 131. The protection layer 160 is disposed on the first metal layer 140 and the second metal layer 150. The protection layer 160 has a second opening O2, a third opening O3, and a fourth opening O4, and the protection layer 160 includes a first protruding part 161, a second protruding part 162, and a flat part 163. The flat part 163 covers the second part 132 exposed by the first metal layer 140, and the flat part 163 surrounds and defines the second opening O2. The first protruding part 161 covers the source electrode 141, the drain electrode 142 and the gate electrode 143, and the first protruding part 161 surrounds and defines the third opening O3. The second protruding part 162 covers the second wall structure 152, and the second protruding part 162 surrounds and defines the fourth opening O4. In the normal direction Z of the substrate 110, the first opening O1, the second opening O2, the third opening O3, and the fourth opening O4 overlap. In addition, the biochip 10 of this embodiment may be configured for detecting the biological material 210 in the solution 200.

The manufacturing method of the biochip 10 of this embodiment is described below. The manufacturing method of the biochip 10 in this embodiment may include the following steps.

First, referring to FIG. 2A, FIG. 3A, FIG. 4 and FIG. 5 at the same time, a substrate 110 is provided, a first insulation layer IL1 is formed on the substrate 110, and a semiconductor layer 120 is formed on the first insulation layer IL1. In this embodiment, the substrate 110 may be a silicon substrate or a silicon wafer. For example, the substrate 110 may be a P-type silicon substrate, but not limited thereto. In this embodiment, the first insulation layer IL1 may be, for example, a gate oxide layer, but not limited thereto.

In this embodiment, the semiconductor layer 120 includes multiple reaction regions 121, multiple source regions 122, multiple drain regions 123, and a central opening 124. The source region 122 and the drain region 123 are separated from each other. The reaction region 121 is located between the adjacent source region 122 and the drain region 123, and the reaction region 121 may connect the source region 122 and the drain region 123. Each reaction region 121 may include at least one reaction unit 1211 (FIG. 2A schematically illustrates five reaction units 1211, but not limited thereto). The central opening 124 may be surrounded by multiple reaction regions 121, multiple source regions 122 and multiple drain regions 123. In this embodiment, the material of the semiconductor layer 120 may include polysilicon or other suitable semiconductor materials, but not limited thereto. In some embodiments, the reaction unit 1211 in the reaction region 121 may be regarded as a channel in the transistor structure. Therefore, when the threshold voltage of the channel (reaction unit 1211) is exceeded, the channel (reaction unit 1211) may be opened, and the current from the drain electrode 142 may be transferred to the source electrode 141 through the channel (reaction unit 1211).

In this embodiment, in the top schematic diagram of FIG. 2A, the semiconductor layer 120 may schematically include eight reaction regions 121, four source regions 122, four drain regions 123, and one central opening 124. The eight reaction regions 121, four source regions 122, four drain regions 123, and one central opening 124 of the semiconductor layer 120 may be arranged into a hollow circular structure. Each pair of adjacent source regions 122 and drain regions 123 may occupy approximately 90 degrees of the entire 360-degree circular structure, and each source region 122 (or drain region 123) may occupy approximately 45 degrees of the entire 360-degree circular structure, but not limited thereto. That is, the disclosure does not limit the number and arrangement shapes of the reaction regions, source regions, drain regions and central openings, and the disclosure does not limit the ratio of each adjacent source region and drain region and the ratio of each source (or drain) region occupying the entire circle.

In addition, in this embodiment, an identification unit (not shown) may also be provided on the reaction unit 1211 of the reaction region 121 of the semiconductor layer 120 for specificity identification and binding to the biological material 210 in the solution 200. Specifically, one end of the identification unit may be connected and fixed to the reaction region 121, and the other end of the identification unit may be configured for identification and is bound to the biological material 210. The identification unit may be a chemical molecule or a biological molecule. For example, the identification unit may be an antibody, an antigen, a nucleic acid, a carbohydrate, or a combination thereof, but not limited thereto, as long as the identification unit may specifically identify and bind to the biological material 210.

Then, referring to FIG. 2A, FIG. 3B, FIG. 4 and FIG. 5 at the same time, a second insulation layer 130 is formed on the semiconductor layer 120. Specifically, the second insulation layer 130 may cover the semiconductor layer 120 and a part of the first insulation layer IL1. The second insulation layer 130 includes a first part 131, a second part 132, a first opening O1, a hole 133, a hole 134, and a hole 135. The first part 131 is disposed corresponding to the central opening 124. The second part 132 and the first part 131 are separated from each other, and the second part 132 surrounds the first part 131. The first opening O1 separates the first part 131 and the second part 132. The first opening O1 may expose multiple reaction regions 121 and a part of the first insulation layer IL1. The hole 133 may penetrate the second part 132 and expose a part of the source region 122, the hole 134 may penetrate the second part 132 and expose a part of the drain region 123, and the hole 135 may penetrate the second part 132 and the first insulation layer IL1 to expose a part of the substrate 110.

Then, referring to FIG. 2B, FIG. 3C, FIG. 4 and FIG. 5 at the same time, a first metal layer 140 is formed on the second part 132 of the second insulation layer 130. Specifically, the first metal layer 140 may expose the first part 131 and a part of the second part 132. The first metal layer 140 includes a source electrode 141, a drain electrode 142, a gate electrode 143, and a first wall structure 144 that are separated from each other. In the normal direction Z of the substrate 110, the source electrode 141 may overlap and be disposed corresponding to the source region 122, and the drain electrode 142 may overlap and be disposed corresponding to the drain region 123. The source electrode 141 may be disposed on the second part 132 and in the hole 133 and be electrically connected to the source region 122. The drain electrode 142 may be disposed on the second part 132 and in the hole 134 and be electrically connected to the drain region 123. The gate electrode 143 may be disposed on the second part 132 and in the hole 135 to contact and be electrically connected to the substrate 110 with conductive properties.

In this embodiment, the source electrode 141, the drain electrode 142, the gate electrode 143, and the first wall structure 144 may be on the same layer. As shown in FIG. 2B, the source electrode 141 may have a substantially annular structure surrounding the first opening O1, the drain electrode 142 may have a substantially annular structure surrounding the source electrode 141 and the first opening O1, the gate electrode 143 may have a substantially annular structure surrounding the drain electrode 142, the source electrode 141, and the first opening O1, and the first wall structure 144 may have a substantially annular structure surrounding the gate electrode 143, the drain electrode 142, the source electrode 141, and the first opening O1. The first wall structure 144 may electrically insulate the source electrode 141, the drain electrode 142, and the gate electrode 143.

Then, referring to FIG. 2C, FIG. 3D, FIG. 4, and FIG. 5 at the same time, an insulation layer IL2 is formed on the first part 131 and the first wall structure 144, and a second metal layer 150 is formed on the first part 131, the first wall structure 144, and the insulation layer IL2. Specifically, the second metal layer 150 includes a biological electrode 151 and a second wall structure 152. The biological electrode 151 is disposed on the first part 131. The second wall structure 152 is disposed on the first wall structure 144. The biological electrode 151 and the second wall structure 152 may be on the same layer, and the biological electrode 151 and the second wall structure 152 are separated from each other. As shown in FIG. 2C, the second wall structure 152 may have a substantially annular structure surrounding the gate electrode 143, the drain electrode 142, the source electrode 141, and the first opening O1. The second wall structure 152 electrically insulates the biological electrode 151.

Then, referring to FIG. 2C, FIG. 3E, FIG. 4, and FIG. 5 at the same time, a protection layer 160 is formed on the first metal layer 140 and the second metal layer 150. Specifically, the protection layer 160 has a second opening O2, a third opening O3, and a fourth opening O4, and the protection layer 160 includes a flat part 163, a first protruding part 161, and a second protruding part 162. The flat part 163 may cover the second part 132 exposed by the first metal layer 140, and the flat part 163 may surround and define the second opening O2. The first protruding part 161 may cover the source electrode 141, the drain electrode 142 and the gate electrode 143, and the first protruding part 161 may surround and define the third opening O3. The second protruding part 162 may cover the second wall structure 152, and the second protruding part 162 may surround and define the fourth opening O4.

In this embodiment, the flat part 163 has an upper surface 163*a* away from the second insulation layer 130, the first protruding part 161 has an upper surface 161*a* away from the second insulation layer 130, and the second protruding part 162 has an upper surface 162*a* away from the second insulation layer 130. In the normal direction Z of the substrate 110, the upper surface 161*a* of the first protruding part 161 is higher than the upper surface 163*a* of the flat part 163, and the upper surface 162*a* of the second protruding part 162 is higher than the upper surface 161*a* of the first protruding part 161.

In this embodiment, through the arrangement of the first metal layer 140 and the second metal layer 150, the first protruding part 161 and the second protruding part 162 may be formed simultaneously during the step of forming the protection layer 160, so it is not necessary to have additional process steps (e.g., increasing the number of photomasks or increasing the number of layers) to manufacture the first protruding part 161 that may be used to form the third opening O3 and the second protruding part 162 that may be used to form the fourth opening O4, which has the effect of simplifying the process.

In this embodiment, in the normal direction Z of the substrate 110, the first opening O1, the second opening O2, the third opening O3, and the fourth opening O4 may overlap. The second opening O2 may connect the first opening O1 and the third opening O3, and the third opening O3 may connect the second opening O2 and the fourth opening O4. The size of the second opening O2 may be substantially similar to the size of the first opening O1. The size of the third opening O3 may be larger than the size of the second opening O2. The size of the fourth opening O4 may be larger than the size of the third opening O3.

In this embodiment, the third opening O3 may include an adding region O31 and multiple detection regions O32. The adding region O31 may be a region where the solution 200 is added to the biochip 10, and the detection region O32 may be a region configured to guide and store the solution 200 to avoid overflow of the solution 200. Specifically, the adding region O31 may be disposed corresponding to the central opening 124, the first part 131, and the biological electrode 151. The detection regions O32 may be disposed corresponding to the reaction regions 121. The detection regions O32 may be connected to the adding region O31, and the detection regions O32 may be arranged radially around the adding region O31, thereby the time for the solution 200 to flow into the detection region O32 may be shortened, and the distribution of the solution 200 may be more uniform.

In this embodiment, since the solution 200 may be first dropped into the adding region O31 in the form of liquid beads, and then flow from the adding region O31 to multiple radially arranged detection regions O32, therefore, by making the diameter (or width) of the adding region O31 larger than the diameter of the liquid bead, the solution 200 may be prevented from overflowing due to the offset (or misalignment) of the adding position during addition. By designing the outline shape of the adding region O31 to be circular to match the shape of the liquid beads, the surface tension of the liquid may be used to prevent the solution 200 from overflowing when the amount of liquid in the solution 200 is too much and is close to overflowing. In other words, this embodiment utilizes the "self-confined structure" formed by the wiring of the biochip itself to increase the alignment error tolerance space and accommodate more solution 200. In this embodiment, the diameter (or width) of the adding region O31 is, for example, about 10 micrometers (μm) to 100 micrometers, and the width of the detection region O32 is, for example, about 3 micrometers, but not limited thereto. In some embodiments, the diameter (or width) of the adding region O31 may also be adjusted based on the diameter of the liquid beads, and the length of the detection region O32 may also be adjusted based on the number of reaction units 1211.

Then, referring to FIG. 4 and FIG. 5 at the same time, in this embodiment, the solution 200 may be disposed at least in the first opening O1, the second opening O2, and the third opening O3, and the solution 200 may at least cover the upper surface 163*a* of the flat part 163, so that the solution 200 may contact the biological electrode 151 and the reaction units 1211 in the reaction regions 121 at the same time. In some embodiments, when the volume of solution 200 is large, the solution 200 may also be disposed in the first opening O1, the second opening O2, the third opening O3, and the fourth opening O4, so that the solution 200 may cover the upper surface 163*a* of the flat part 163 and the upper surface 161*a* of the first protruding part 161.

Compared with general biochips that use external probe electrodes (e.g., silver/silver chloride electrodes) to detect biological materials, this embodiment may significantly reduce the overall volume of the biochip 10 by integrating the biological electrode 151 into the biochip 10, and may reduce the complicated steps and costs of the post-processing process (e.g., it is not necessary to manufacture additional external probe electrodes).

In this embodiment, the solution 200 may include, for example, body fluids such as serum, and the biological material 210 may include, for example, microorganisms or biomolecules, but not limited thereto. For example, microorganisms may include bacteria, viruses, or combinations thereof, and biomolecules may include nucleic acids (including DNA, ribonucleic acids, or combinations thereof), nucleotides, proteins, carbohydrates, lipids, or combinations thereof, but not limited thereto.

In this embodiment, the working principle of the biochip 10 may include testing before the solution 200 is added and detection after the solution 200 is added. Specifically, the testing before the solution 200 is added is: the gate electrode 143 is first turned on, so that the voltage provided by the gate electrode 143 may control (turn on or off) the reaction unit 1211 in the reaction region 121 through the substrate 110 with conductive properties separated by the first insulation layer IL1. Then, the current amount of the drain electrode 142 (i.e., the first current amount) is measured to test whether the reaction unit 1211 may be normally conducted so that the current from the source electrode 141 may pass. The detection after the solution 200 is added is: when the solution 200 may contact the biological electrode 151 and the reaction units 1211 in the reaction regions 121 at the same time, the biological electrode 151 is first turned on, so that the voltage provided by the biological electrode 151 may control (turn on or off) the reaction unit 1211 in the reaction region 121 separated by the solution 200. Then, the current amount of the drain electrode 142 (i.e., the second current amount) is measured, and the first current amount and the second current amount are compared so as to detect the biological material 210 in the solution 200. In addition, in this embodiment, during the detection after the solution 200 is added, the gate electrode 143 may be in an off or on state. When the gate electrode 143 is in an on state, the voltage provided by the gate electrode 143 can, for example, be used to enhance the reaction between the biological material 210 and the reaction unit 1211.

In this embodiment, the reaction regions 121 in one of the detection units 100 of the biochip 10 may be configured to detect the same kind of biological material 210, thereby the detection sensitivity may be improved by accumulating signals detected by the reaction regions 121.

In this embodiment, the first protruding part 161 may completely surround the third opening O3, and the second protruding part 162 may completely surround the fourth opening O4. In detail, since the source electrode 141, the drain electrode 142, and the gate electrode 143 have substantially annular structures that may surround the first opening O1, the first protruding part 161 disposed above the source electrode 141, the drain electrode 142 and the gate electrode 143 may be a closed pattern that completely surrounds the first opening O1, the second opening O2, and the third opening O3, so as to confine the solution 200 within the third opening O3 and prevent the solution 200 from overflowing outside the third opening O3. In addition, since the second wall structure 152 is disposed on the first wall structure 144 and the second wall structure 152 has substantially an annular structure that may surround the first opening O1, the second protruding part 162 disposed above the second wall structure 152 may be a closed pattern that completely surrounds the first opening O1, the second opening O2, the third opening O3, and the fourth opening O4, so as to confine the solution 200 within the fourth opening O4 and prevent the solution 200 from overflowing outside the fourth opening O4, as shown in FIG. 4 and FIG. 5.

For example, when the solution 200 added to the third opening O3 overflows, the arrangement of the second protruding part 162 may confine the solution 200 within the fourth opening O4 and prevent the solution 200 from overflowing, thereby preventing the solution from overflowing into another adjacent detection unit 100 and interfering with the detection result of another biological material. Therefore, compared with a general biochip, the biochip 10 of this embodiment may increase the volume of the solution 200 that the biochip 10 may hold through the arrangement of the fourth opening O4, so as to accommodate a larger volume of the solution 200 and improve the operational flexibility and convenience of the biochip 10. In this way, multiple detection units 100 in the biochip 10 of this embodiment may be respectively used to detect different kinds of biological materials at the same time without the concern of overflow and subsequent cross-contamination between different detection units 100. This in turn enables the biochip 10 to detect multiple biological materials at the same time.

Other embodiments are described below for illustrative purposes. It is to be noted that the following embodiments use the reference numerals and a part of the contents of the above embodiments, and the same reference numerals are used to denote the same or similar elements, and the description of the same technical contents is omitted. For the description of the omitted part, reference may be made to the above embodiments, and details are not described in the following embodiments.

Figure 6:
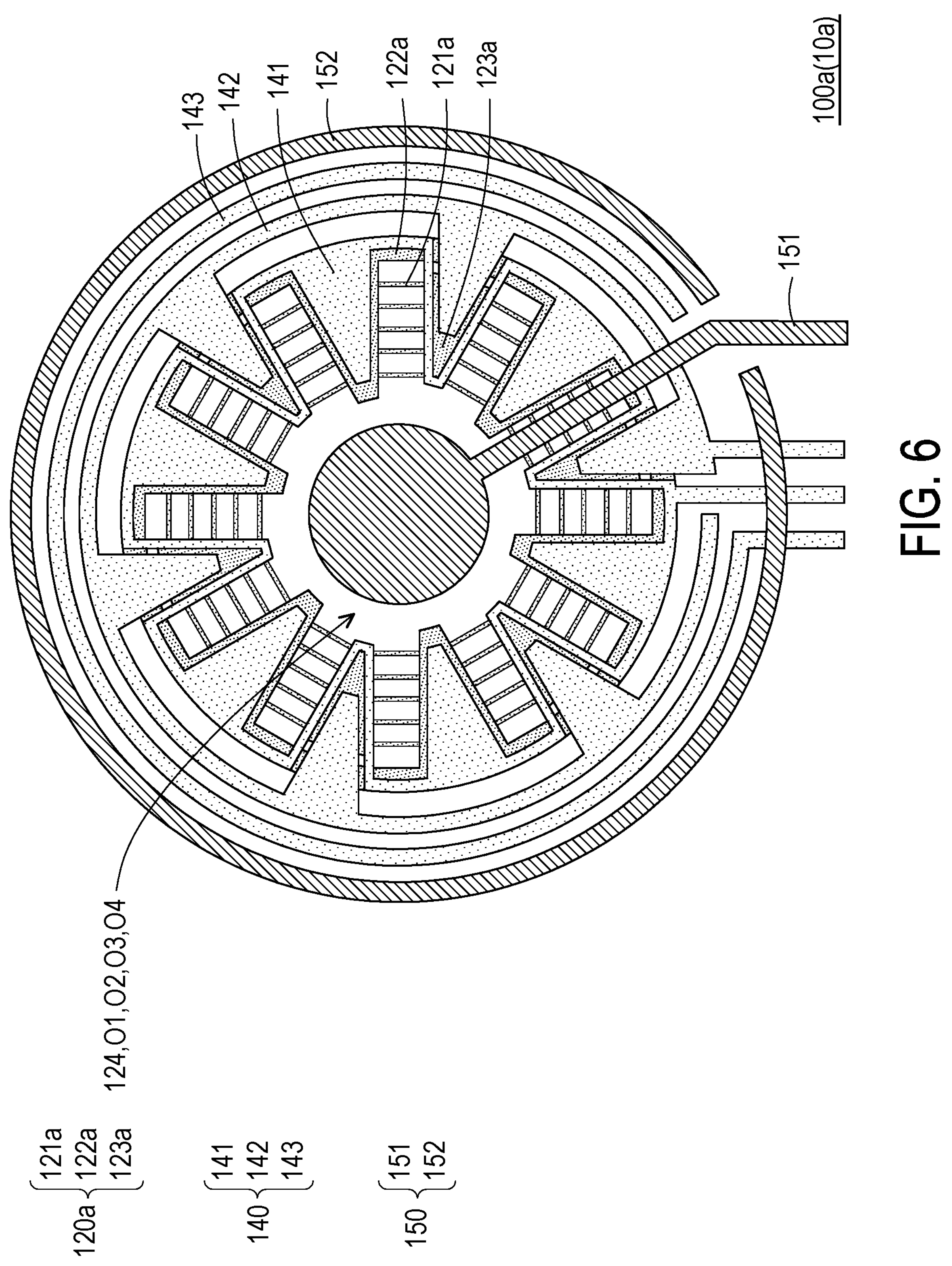
FIG. 6 is a top schematic diagram of a detection unit in a biochip of another embodiment of the disclosure.

FIG. 6 is a top schematic diagram of a detection unit in a biochip of another embodiment of the disclosure. Referring to FIG. 6 and FIG. 2C at the same time, the biochip 10*a* of this embodiment is similar to the biochip 10 in FIG. 2C. The main difference between the two is that in the detection unit 100*a* of the biochip 10*a* of this embodiment, the semiconductor layer 120*a* includes more reaction regions 121*a*, source regions 122*a*, and drain regions 123*a*.

Specifically, referring to FIG. 6, the semiconductor layer 120*a* may include twelve reaction regions 121*a*, six source regions 122*a*, six drain regions 123*a*, and one central opening 124. Each pair of adjacent source regions 122*a* and drain regions 123*a* may occupy approximately 60 degrees of the entire 360-degree circular structure, and each source region 122*a* (or drain region 123*a*) may occupy approximately 30 degrees of the entire 360-degree circular structure. Thereby, the detection unit 100*a* may further improve the detection sensitivity by accumulating signals detected by more reaction regions 121*a* (or reaction units 1211).

In some embodiments, more reaction units may also be added by adjusting the length of the reaction region (the length of the detection region) in the detection unit, thereby the detection unit may further improve detection sensitivity by accumulating signals detected by more reaction units.

To sum up, in the biochip and the manufacturing method thereof according to an embodiment of the disclosure, by making the diameter (or width) of the adding region larger than the diameter of the liquid bead, the solution may be prevented from overflowing due to the offset (or misalignment) of the adding position during addition. By designing the outline shape of the adding region to be circular to match the shape of the liquid beads, the surface tension of the liquid may be used to prevent the solution from overflowing when the amount of liquid in the solution is too much and is close to overflowing. In other words, this embodiment utilizes the "self-confined structure" formed by the wiring of the biochip itself to increase the alignment error tolerance space and accommodate more solution. By disposing multiple reaction regions in one detection unit to detect the same kind of biological material, the detection sensitivity may be improved by accumulating signals detected by the multiple reaction regions. Compared with general biochips, the biochip of this embodiment may increase the volume of solution that the biochip may hold through the arrangement of the fourth opening, so as to accommodate a larger volume of solution without the concern of overflow and subsequent cross-contamination. This in turn enhances the operational flexibility and convenience of the biochip. In addition, since the multiple detection units in the biochip of this embodiment may be respectively used to detect different kinds of biological materials without the concern of overflow and subsequent cross-contamination between different detection units. This in turn enables the biochip to detect multiple biological materials at the same time without interfering with each other. In addition, in some embodiments, by increasing the number of reaction regions in the detection unit or adjusting the length of the reaction region in the detection unit (the length of the detection region) to increase the number of reaction units, the detection unit may further improve detection sensitivity by accumulating signals detected by more reaction units.

Although the disclosure has been described in detail with reference to the above embodiments, they are not intended to limit the disclosure. Those skilled in the art should understand that it is possible to make changes and modifications without departing from the spirit and scope of the disclosure. Therefore, the protection scope of the disclosure shall be defined by the following claims.

What is claimed is:

1. A biochip, configured for detecting biological material in a solution, comprising at least one detection unit, wherein the detection unit comprises:
   - a substrate;
   - a first insulation layer, disposed on the substrate;
   - a semiconductor layer, disposed on the first insulation layer and comprises a plurality of reaction regions;
   - a second insulation layer, disposed on the semiconductor layer and comprises:
     - a first part;
     - a second part, surrounding the first part; and
     - a first opening, separating the first part and the second part and exposing the reaction regions;

a first metal layer, disposed on the second part and comprising a source electrode, a drain electrode, a gate electrode, and a first wall structure that are separated from each other;

a second metal layer, comprising:

a second wall structure, disposed on the first wall structure; and a biological electrode, disposed on the first part; and a protection layer, disposed on the first metal layer and the second metal layer, having a second opening, a third opening and a fourth opening, and comprising:

a flat part, covering the second part exposed by the first metal layer, and surrounding and defining the second opening;

a first protruding part, covering the source electrode, the drain electrode, and the gate electrode, and surrounding and defining the third opening; and a second protruding part, covering the second wall structure, and surrounding and defining the fourth opening;

wherein in a normal direction of the substrate, the first opening, the second opening, the third opening, and the fourth opening overlap.

2. The biochip according to claim 1, wherein the semiconductor layer further comprises a source region and a drain region, the source electrode surrounds the first opening and is electrically connected to the source region, the drain electrode surrounds the source electrode and is electrically connected to the drain region, the gate electrode surrounds the drain electrode and is electrically connected to the substrate, and the first wall structure surrounds the gate electrode.

3. The biochip according to claim 2, wherein the source electrode, the drain electrode, the gate electrode and the first wall structure are on a same layer, and the first wall structure electrically insulates the source electrode, the drain electrode, and the gate electrode.

4. The biochip according to claim 1, wherein the solution is disposed in at least the first opening, the second opening and the third opening, and the solution contacts the biological electrode and the reaction regions of the semiconductor layer.

5. The biochip according to claim 4, wherein the biological electrode and the second wall structure are on a same layer, the biological electrode and the second wall structure are separated from each other, and the second wall structure electrically insulates the biological electrode.

6. The biochip according to claim 1, wherein the first protruding part completely surrounds the third opening, and the second protruding part completely surrounds the fourth opening.

7. The biochip according to claim 1, wherein in the normal direction, an upper surface of the second protruding part is higher than an upper surface of the first protruding part, and the upper surface of the first protruding part is higher than an upper surface of the flat part.

8. The biochip according to claim 1, wherein the third opening is larger than the second opening, and the fourth opening is larger than the third opening.

9. The biochip according to claim 1, wherein the third opening comprises:

an adding region, disposed corresponding to the first part; and a plurality of detection regions, connected to the adding region and disposed corresponding to the reaction regions.

10. A manufacturing method of a biochip, comprising:

providing a substrate;

forming a first insulation layer on the substrate;

forming a semiconductor layer on the first insulation layer, wherein the semiconductor layer comprises a plurality of reaction regions;

forming a second insulation layer on the semiconductor layer, wherein the second insulation layer comprises:

a first part;

a second part, surrounding the first part; and a first opening, separating the first part and the second part and exposing the reaction regions;

forming a first metal layer on the second part, wherein the first metal layer comprises a source electrode, a drain electrode, a gate electrode, and a first wall structure that are separated from each other;

forming a second metal layer, wherein the second metal layer comprises:

a second wall structure, disposed on the first wall structure; and a biological electrode, disposed on the first part; and forming a protection layer on the first metal layer and the second metal layer, wherein the protection layer has a second opening, a third opening and a fourth opening, and comprises:

a flat part, covering the second part exposed by the first metal layer, and surrounding and defining the second opening;

a first protruding part, covering the source electrode, the drain electrode, and the gate electrode, and surrounding and defining the third opening; and a second protruding part, covering the second wall structure, and surrounding and defining the fourth opening;

wherein in a normal direction of the substrate, the first opening, the second opening, the third opening, and the fourth opening overlap.

* * * * *